(12) United States Patent
Sudoh

(10) Patent No.: US 6,909,493 B2
(45) Date of Patent: Jun. 21, 2005

(54) CORRECTION MEMBER, RETAINER, EXPOSURE APPARATUS, AND DEVICE FABRICATION METHOD

(75) Inventor: Yuji Sudoh, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 131 days.

(21) Appl. No.: 10/388,822

(22) Filed: Mar. 14, 2003

(65) Prior Publication Data

US 2003/0179470 A1 Sep. 25, 2003

(30) Foreign Application Priority Data

Mar. 20, 2002 (JP) ........................................ 2002-078118

(51) Int. Cl.$^7$ ........................ G03B 27/54; G03B 27/58; G03B 27/62; G03B 7/02
(52) U.S. Cl. .............................. 355/75; 355/67; 355/72; 359/818; 359/819; 359/823
(58) Field of Search ............................. 355/53, 67, 72, 355/75; 359/818, 819, 823

(56) References Cited

U.S. PATENT DOCUMENTS 6,239,924 B1   5/2001  Watson et al.
6,400,516 B1 *  6/2002  Spinali ....................... 359/819

FOREIGN PATENT DOCUMENTS

JP   2001-74991    3/2001
JP   2001-284226   10/2001

* cited by examiner

*Primary Examiner*—Rodney Fuller
(74) *Attorney, Agent, or Firm*—Morgan & Finnegan, L.L.P.

(57) ABSTRACT

A correction member for correcting a gravity deformation of an optical element includes a first unit for applying an elastic force to the optical element substantially in an anti-gravity direction, and a second unit, arranged opposite to the first unit through the optical element, for applying an elastic force to the optical element substantially in a gravity direction.

8 Claims, 9 Drawing Sheets

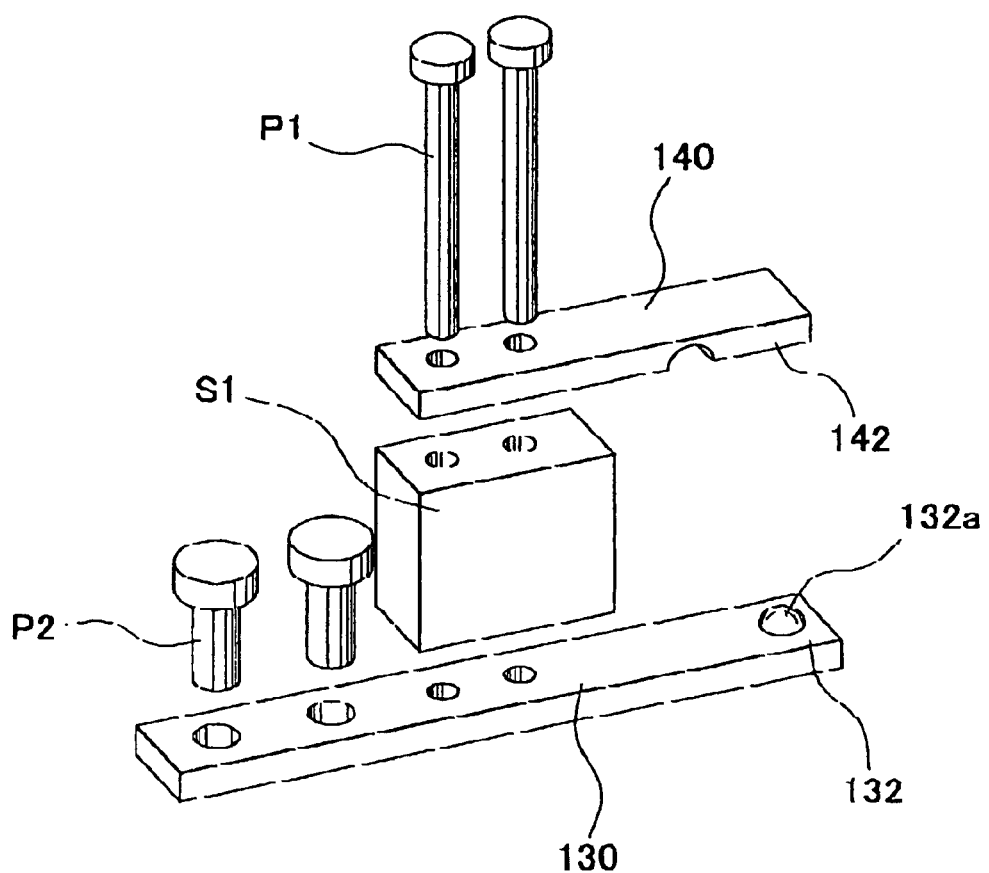
F I G . 2

CORRECTION MEMBER, RETAINER, EXPOSURE APPARATUS, AND DEVICE FABRICATION METHOD

BACKGROUND OF THE INVENTION

The present invention relates generally to precision machines for mounting an optical element, and more particularly to a projection optical system in an exposure apparatus, etc. The present invention is suitable, for example, for a retainer that holds an optical element for a more precise imaging relationship in an exposure apparatus in projecting and exposing an image on an original sheet, such as a mask or reticle (these terms are used interchangeably in this application) onto an object, such as a single crystal substrate for a semiconductor wafer, a glass plate for a liquid crystal display (LCD). The exposure apparatus is used to fabricate a semiconductor device, an image pick-up device (such as a CCD), and a thin film magnetic head.

The fabrication of a device using the lithography technique has employed a projection exposure apparatus that uses a projection optical system to project a circuit pattern formed on a mask onto a wafer and the like, thereby transferring the circuit pattern. The projection optical system enables diffracted beams from the circuit pattern to interfere on the wafer and the like, so as to form an image.

The devices to be mounted on electronic apparatuses should be highly integrated to meet recent demands for miniaturization and low profile of electronic apparatuses, and finer circuit patterns to be transferred or higher resolution have been demanded increasingly. A short wavelength of a light source and an increased numerical aperture ("NA") in a projection optical system are effective to the high resolution as well as a reduced aberration in the projection optical system.

An optical element, such as a lens and a mirror, when deforming in an projection optical system causes aberration because an optical path refracts before and after the deformation and light that is supposed to form an image at one point does not converge on one point. The aberration causes a positional offset and short-circuits a circuit pattern on a wafer. On the other hand, a wider pattern size to prevent short-circuiting is contradictory to a fine process.

Therefore, a projection optical system with small aberration should hold its optical element(s) without changing a shape and a position relative to the optical axis of the optical element in the projection optical system so as to maximize the original optical performance of the optical element. In particular, the projection lens tends to have a larger caliber and a larger lens capacity due to the recent high NA in the projection optical system, and easily deforms by its own weight. In addition, diffraction optical elements, which have been eagerly studied recently, also tend to deform due to its thinness.

Accordingly, Japanese Laid-Open Patent Application No. 2001-284226 proposes, as shown in FIG. 7, a retainer 1000 that fixes a lens 1300 using three or more (e.g., thirty in the embodiment) lens support points 1200 formed on a cell 1100, and springs 1400 for pressing the lens 1300 from a side opposite to the lens support points 1200. A compression force is designed or calculated to the extent that a lens of a low breaking strength, such as a lens made of calcium fluoride (CaF$_2$), does not get damaged. Here, FIG. 7 is an exploded perspective view of the exemplary conventional retainer 1000.

Similarly, Japanese Laid-Open Patent Application No. 2001-74991 (corresponding to U.S. Pat. No. 6,239,924) proposes, as shown in FIG. 8, a retainer 2000 that fixes a lens installed onto seats on three flex mount parts 2200 that are radially arranged at regular intervals on an inner circumference on a cell 2100, and a spring member with small rigidity in a non-optical axis direction for applying a compression force to the lens from the top of the lens according to the lens shape. Soft mount parts 2300 dispersedly support the lens among the flex mount parts 2200 so as to minimize the gravity deflection and so as not to excessively restrain the positioning of the lens. Here, FIG. 8 is a schematic top transparent view showing the exemplary conventional retainer 2000.

However, Japanese Laid-Open Patent Application No. 2001-284226 does not consider the flatness of the lens support points 1200 and lens deformation. For example, when the heights of the lens support points 1200 deviate, only three points among them support points 1200 even when there are thirty or more lens. Therefore, the portion except the above three support points does not contact the lens but receives forces from the springs 1400, causing the lens to deform. Thus, this reference has a difficulty in realizing a projection optical system with little aberration due to such a lens's deformation.

On the other hand, Japanese Laid-Open Patent Application No. 2001-74991 has a careful structure to a lens deformation or distortion, but requires forces opposite to those applied by the flex mount parts at three flex mount parts 2200 so as to apply a compression force to prevent the lateral offset of the lens. This causes the lens to incur a large load from the spring members of the flex mount parts 2200. This causes the large birefringence and possibly breaks the lens, and has a difficulty in realization.

BRIEF SUMMARY OF THE INVENTION

Accordingly, it is an exemplified object of the present invention to provide a correction member, a retainer, an exposure apparatus, a device fabrication method which may provide desired optical performance by reducing aberration due to a deformation and a positional offset of an optical element which otherwise deteriorates the imaging performance.

A correction member according to one aspect of the present invention for correcting a gravity deformation of an optical element includes a first unit (or first spring part) for applying an elastic force to the optical element in a substantially anti-gravity direction, and a second unit (or second spring part), arranged opposite to the first unit through the optical element, for applying an elastic force to the optical element in a substantially gravity direction. Here, it is preferable that the optical axis is not perpendicular to either the gravity direction or anti-gravity direction. In particular, the optical axis is preferably substantially parallel to the gravity and anti-gravity directions.

A retainer according to another aspect of the present invention includes a plurality of support members for supporting the optical element, and the above correction member. There may be three holding parts between which each first member and each second member are provided.

A retainer of another aspect of the present invention includes three support parts for supporting an optical element, a first unit for applying a first elastic force to the optical element in a substantially anti-gravity direction, and a second unit, arranged opposite to the first unit through the optical element, for applying a second elastic force to the optical element in a substantially gravity direction. The retainer may further include a presser member at a position opposite to the support member through the optical element.

The first elastic force may be larger than the second elastic force. The first elastic force ($F_1$), the second elastic force ($F_2$) and a compression force ($F_3$) by the compression part against the optical element meet $F_{max} \geq F_1 \geq M(A/(\mu+1))/2n$, $F_{max} \geq F_2 \geq M(A/(\mu-1))/2n$, $F_{max} \geq F_3 \geq BM$, where M is a mass of the optical element, n is the number of first and second units, $\mu$ is a coefficient of static friction between the optical element and the first and units, A is a lateral gravity resistance specification, B is a longitudinal gravity resistance specification, and $F_{max}$ is a breaking load of the optical element.

The optical element may have a certain curvature, and the first and second units may have an application surface for applying the elastic force to the optical element along the curvature.

An exposure apparatus of another aspect of the present invention includes the above retainer, and an optical system for exposing a pattern formed on a mask or reticle onto an object through the optical element held by the retainer.

A device fabrication method of another aspect of the present invention includes the steps of exposing a pattern on a mask, onto an object by using the above exposure apparatus, and performing a predetermined process for the exposed object. Claims for the device fabrication method that exhibits operations similar to those of the above exposure apparatus cover devices as their intermediate products and finished products. Moreover, such devices include semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

BRIEF DESCRIPTION OF THE DRAWINGS

FIG. 2 is an enlarged typical view of a support part and a compression member shown in FIG. 1.

DETAILED DESCRIPTION OF THE PREFERRED EMBODIMENTS

Figure 1:
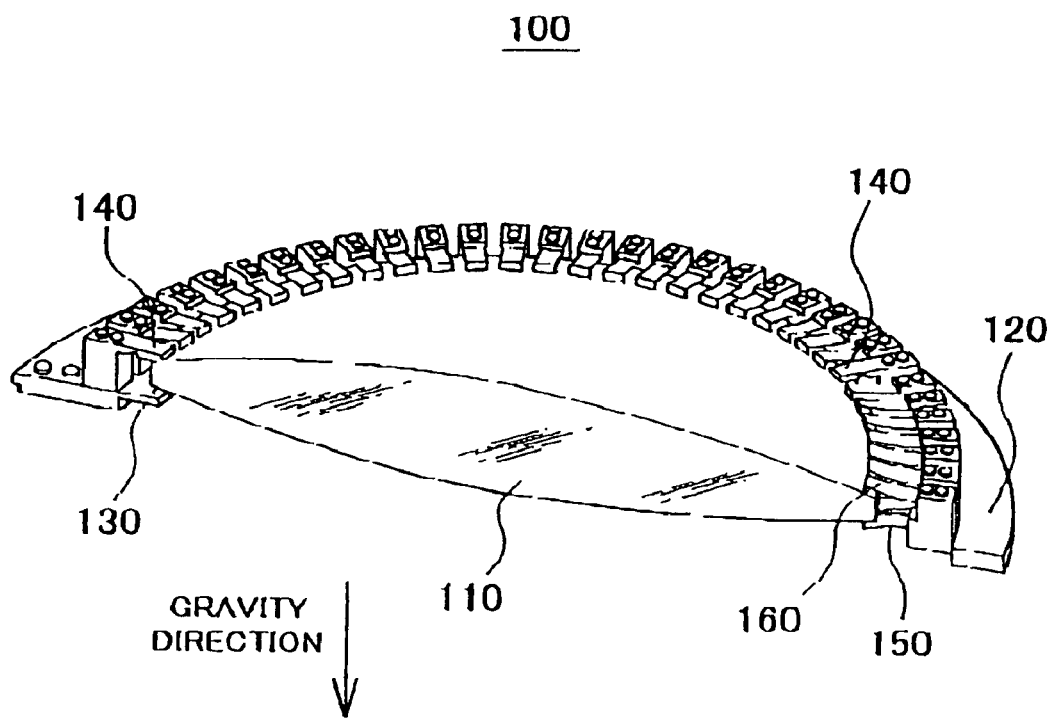
FIG. 1 is a schematic sectional and perspective view of a retainer of one embodiment according to the present invention applicable to a projection optical system in an exposure apparatus.

Referring now to accompanying drawings, a description will be given of an illustrative retainer 100 and exposure apparatus 200 of the present invention. However, the present invention is not limited to these embodiments, and each element may be replaced within a scope of this invention. For example, although the retainer 100 is applied to a projection optical system 230 in the exposure apparatus 200 in the instant embodiment, it is applicable to an illumination optical system 214 in the exposure apparatus 200 and other known optical systems. Here, FIG. 1 is a schematic sectional and perspective view of the inventive retainer applicable to the projection optical system in the exposure apparatus 200. The gravity and anti-gravity directions are parallel to the optical axis of the optical element 110, as shown in an arrow direction in FIG. 1. When the optical axis of the optical element is parallel to the gravity and anti-gravity directions, the gravity deformation of the optical element becomes the largest and the gravity deformation often affects the optical performance. Therefore, the instant embodiment applies the present invention to a case where the optical axis of the optical element is parallel to the gravity and anti-gravity directions. Although FIG. 1 is such a sectional view as shows two support parts 130, there are actually three support parts.

As best shown in FIG. 1, the retainer 100 includes a cell member 120, the support parts 130, compression members 140 opposite to support parts 130, a first spring part 150, a second spring part 160 opposite to the first spring part 150, and holds the optical element 110. The compression member 140 does not have to contact the optical element 110 actually. There may be an interval between the optical element 110 and compression member 140 corresponding to a positioning tolerance in the optical-axis direction of the optical element 110. In this embodiment, the interval between the optical element 110 and the compression member 140 is 0.1 $\mu$m or less.

The optical element 110 is mounted on the support parts 130, which will be described later, and images light using reflections, refractions, diffractions, etc. The optical element 110 includes, for example, a lens, a parallel plate glass, a prism, a mirror, and a Fresnel zone plate, a kinoform, a binary optics, a hologram, and other diffraction optical elements.

The cell member 120 mounts three support parts 130 for supporting the optical element 110 at three points, and the first spring part 150, which will be described later. The cell member 120 is a ring member formed around the optical axis, and made of a material having a coefficient of linear expansion substantially equal to that of the optical element 110. This structure may prevent the external force from deforming or stressing the optical element 110 due to a relative displacement resulting from different linear expansions between the optical element 110 and the cell member 120.

FIG. 2 shows an enlarged typical view of the support part 130 and compression member 140 shown in FIG. 1. The support part 130 has, as shown in FIG. 2, a mount part 132 for mounting the optical element 110 to support the optical element 110 at three points. In other words, the support part 130 is arranged at three points on the cell member 120 at approximately regular intervals around the optical axis. Since the support parts 130 are distributed on the optical element 110 in its circumferential direction at approximately regular intervals, the optical element 110 is fixed stably by the support parts 130. The mount part 132 of the support part 130 forms, for example, a spherical absorption member 132a to mount the optical element 110 without damaging the optical element 110 while minimizing the contact area with the optical element 110 (at one point). The support part 130 is secured onto the cell member 120 through pins P2.

The compression member 140 is provided at a side opposite to the support parts 130 with respect to the optical element 110. The compression member 140 compresses the optical element 110, and fixes a position in the optical-axis or longitudinal direction of the optical element 110 with the support parts 130. More specifically, the compression member is jointed, as shown in FIG. 2, through spacers S1 and pin P1. A compression surface 142 on the compression member 140 applies a compression force to the optical element 110 and holds the optical element 110 using the support parts 130 and compression member 140. The compression surface 142 on the compression member 140 is made of an elastic member or formed with a curvature corresponding to that of the optical element 110 so that the optical element 110 may not be damaged.

Turning back to FIG. 1, the first spring part 150 is provided among three support parts 130, and mounted on the cell member 120. The second spring part 160 is provided at a side opposite to the first spring part 150 with respect to the optical element 110.

Figure 3:
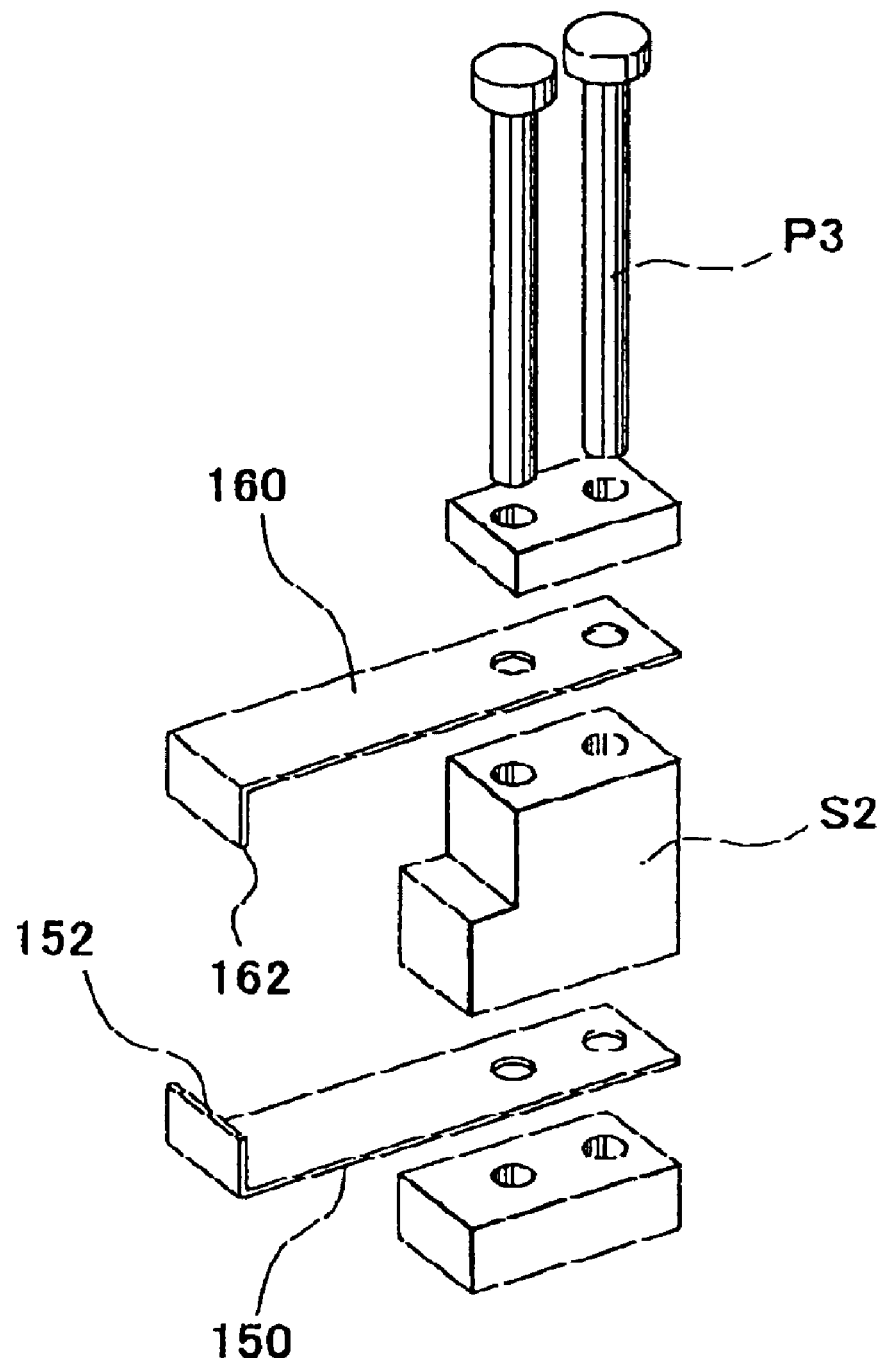
FIG. 3 is an enlarged typical view of first and second spring parts shown in FIG. 1.

The first and second spring parts 150 and 160 are jointed, as shown in FIG. 3, through spacers S2 and pins P3. The first spring part 150 applies a first elastic force to the optical element 110 in the anti-gravity direction through an application surface 152. The second spring part 160 applies a second elastic force smaller than the first elastic force to the optical element 110 through an application surface 162. In other words, a synthetic force between the first and second elastic forces applied by the first and second spring parts 150 and 160 pushes up the optical element 110 in the anti-gravity direction. The first and second spring parts 150 and 160 do not have to be provided at the same position in the circumferential direction of the optical element 110. For example, the second spring part 160 may be provided at both positions of the first spring part 150 in the circumferential direction of the optical element 110. The application surfaces 152 and 162 on the first and second spring parts 150 and 160 enhances a dispersion of the stress at the contact area on the optical element 110, and thus are formed along the curvature of the optical element 110.

Here, the directions in which the first and second spring parts 150 and 160 apply to the optical element 110 may be offset from the gravity and anti-gravity directions, but they preferably accord with the gravity and anti-gravity directions substantially. The directions in which the first and second spring parts 150 and 160 apply to the optical element 110 are preferably less than 1 degree, more preferably less than 0.3 degrees relative to the gravity and anti-gravity directions depending upon an inclination of a lens surface, an inclination of the lens itself, the way, orientation, and direction of deformations of the first and second spring parts 150 and 160.

The first and second spring parts 150 and 160 apply first and second elastic forces, respectively, to the optical element 110, and a dispersion of these forces serves to position the optical element 110 in a direction perpendicular to the optical-axis direction of the optical element 110 or in the lateral direction. Therefore, the first and second spring parts 150 and 160 may position the optical element 110 in the direction perpendicular to the optical-axis direction without breaking or deforming the optical element 110. The first elastic force is set to be larger than the second elastic force so that the gravity deformation of the optical element 110 may be cancelled out or reduced.

In other words, the retainer 100 position the optical element 110 in the optical-axis direction using the support parts 130 and compression part 140, and position the optical element 110 in a direction perpendicular to the optical-axis direction using the first and second spring parts 150 and 160. In order to minimize the gravity deformation of the optical element 110, the first and second spring parts 150 and 160 are adjusted. More specifically, the first and second elastic forces may be adjusted by making the first and second spring parts 150 and 160 of materials with different elastic coefficients and by adjusting the height of the spacer S2.

Therefore, the retainer 100 sets the first elastic force $F_1$ applied by each spring part 150 to the optical element 110, the second elastic force $F_2$ applied by each spring part 160 to the optical element 110, and a compression force $F_3$ by the compression part against the optical element to meet $F_{max} \geq F_1 \geq M(A/(\mu+1))/2n$ $F_{max} \geq F_2 \geq M(A/(\mu-1))/2n$ $F_{max} \geq F_3 \geq BM,$ where M is a mass of the optical element 110, n is the number of first and second spring parts 150 and 160, p is a coefficient of static friction between the optical element 110 and the first and second spring parts 150 and 160, A is a lateral gravity resistance specification, B is a longitudinal gravity resistance specification, and $F_{max}$ is a breaking load of the optical element 110.

This positions the optical element 110 in the optical-axial direction and a direction perpendicular to the optical-axis direction without breaking or greatly deforming the optical element 110 as well as minimizing the gravity deformation of the optical element 110, reducing the aberration that results from the deformation and positional offset of the optical element 110, which otherwise deteriorates the imaging performance, and consequently realizing the desired optical performance.

Figure 4:
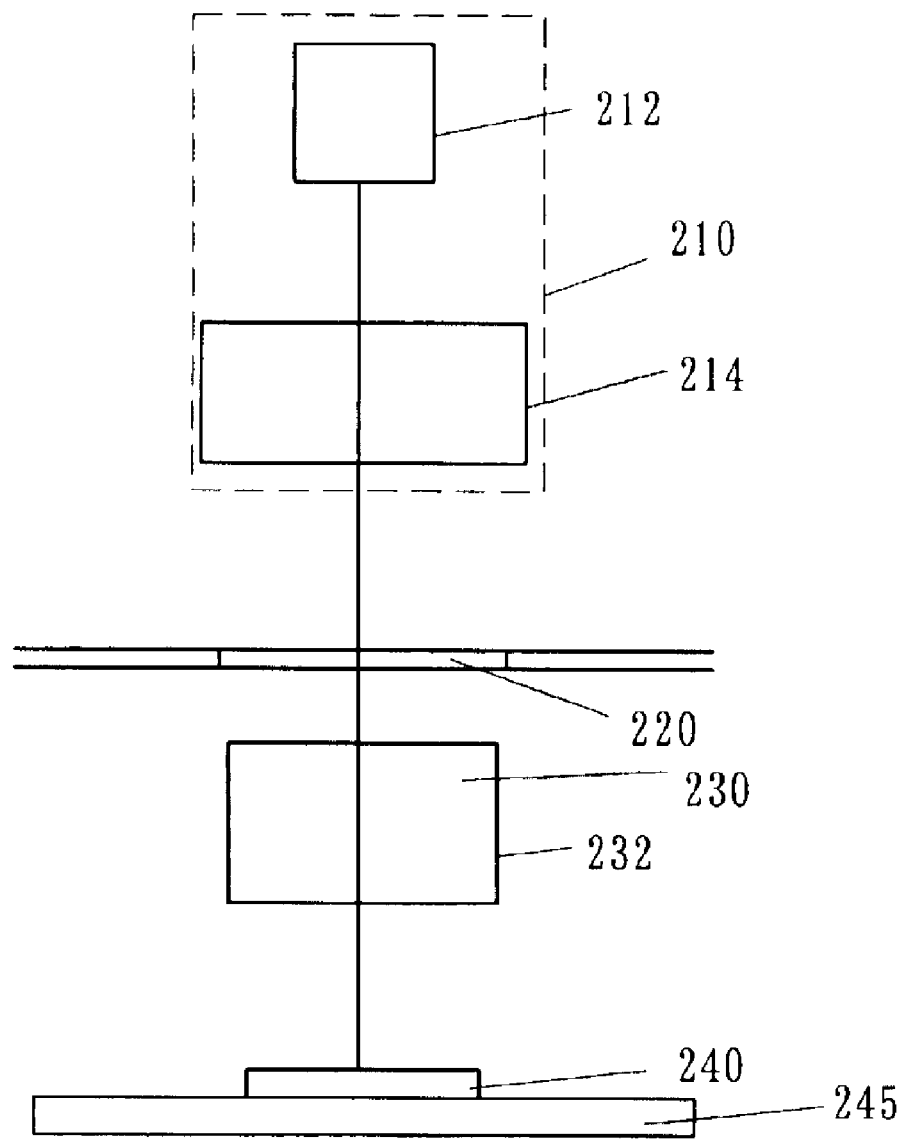
FIG. 4 is a schematic block view of the exemplary exposure apparatus according to the present invention.

Referring now to FIG. 4, a description will be given of the projection optical system 230 to which the inventive retainer 100 is applied and the exposure apparatus 200 having the same. Here, FIG. 4 is a schematic block diagram of the illustrative exposure apparatus 200 of the instant embodiment. The exposure apparatus 200 includes, as shown in FIG. 4, an illumination apparatus 210 for illuminating a mask 220 which forms a circuit pattern, a projection optical system 230 that projects diffracted light created from the illuminated mask pattern onto a plate 240, and a stage 245 for supporting the plate 240.

The exposure apparatus 200 is a projection exposure apparatus that exposes onto the plate 240 a circuit pattern created on the mask 220, e.g., in a step-and-repeat or a step-and-scan manner. Such an exposure apparatus is suitable for a sub-micron or quarter-micron lithography process, and this embodiment exemplarily describes a step-and-scan exposure apparatus (which is also called "a scanner"). "The step-and-scan manner", as used herein, is an exposure method that exposes a mask pattern onto a wafer by continuously scanning the wafer relative to the mask, and by moving, after a shot of exposure, the wafer stepwise to the next exposure area to be shot. "The step-and-repeat manner" is another mode of exposure method that moves a wafer stepwise to an exposure area for the next shot every shot of cell projection onto the wafer.

The illumination apparatus 210 illuminates the mask 220 which forms a circuit pattern to be transferred, and includes a light source unit 212 and an illumination optical system 214.

The light source unit 212 uses as a light source, for example, as ArF excimer laser with a wavelength of approximately 193 nm, a KrF excimer laser with a wavelength of approximately 248 nm, and $F_2$ excimer laser with a wavelength of approximately 153 nm, but the a type of laser is not limited to excimer laser and a YAG laser may be, for example. Similarly, the number of laser units is not limited. A EUV light source is also applicable. For example, two independently acting solid lasers would cause no coherence between these solid lasers and reduces speckles resulting from the coherence. An optical system for reducing speckles may swing linearly or rotationally. When the light source unit 212 uses laser, it is desirable to employ a beam shaping optical system that shapes a parallel beam from a laser source to a desired beam shape, and an incoherently turning optical system that turns a coherent laser beam into an incoherent one. A light source applicable to the light source unit 212 is not limited to a laser, and may use one or more lamps such as a mercury lamp and a xenon lamp. When EUV light (with a wavelength of 10 to 15 nm) used for a light source, it is preferable that an optical path from the light source to a wafer includes only mirrors (or reflecting optical elements) in the illumination and projection optical systems.

The illumination optical system 214 is an optical system that illuminates the mask 220, and includes a lens, a mirror, a light integrator, a stop, and the like, for example, a condenser lens, a fly-eye lens, an aperture stop, a condenser lens, a slit, and an image-forming optical system in this order. The illumination optical system 214 can use any light whether it is axial or non-axial light. The light integrator may include a fly-eye lens or an integrator formed by stacking two sets of cylindrical lens array plates (or lenticular lenses), and be replaced with an optical rod or a diffractive element. The inventive retainer 100 may be used to hold the optical element, such as a lens in the illumination optical system 214.

The mask 220 is made, for example, of quartz, forms a circuit pattern (or an image) to be transferred, and is supported and driven by a mask stage (not shown). Diffracted light emitted from the mask 220 passes the projection optical system 230, thus and then is projected onto the plate 240. The mask 220 and the plate 240 are located in an optically conjugate relationship. Since the exposure apparatus 200 of this embodiment is a scanner, the mask 220 and the plate 240 are scanned at the speed ratio of the reduction ratio of the projection optical system 230, thus transferring the pattern on the mask 220 to the plate 240. If it is a step-and-repeat exposure apparatus (referred to as a "stepper"), the mask 220 and the plate 240 stand still in exposing the mask pattern.

The projection optical system 230 may use an optical system solely including a plurality of lens elements, an optical system including a plurality of lens elements and at least one concave mirror (a catadioptric optical system), an optical system including a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

Figure 9:
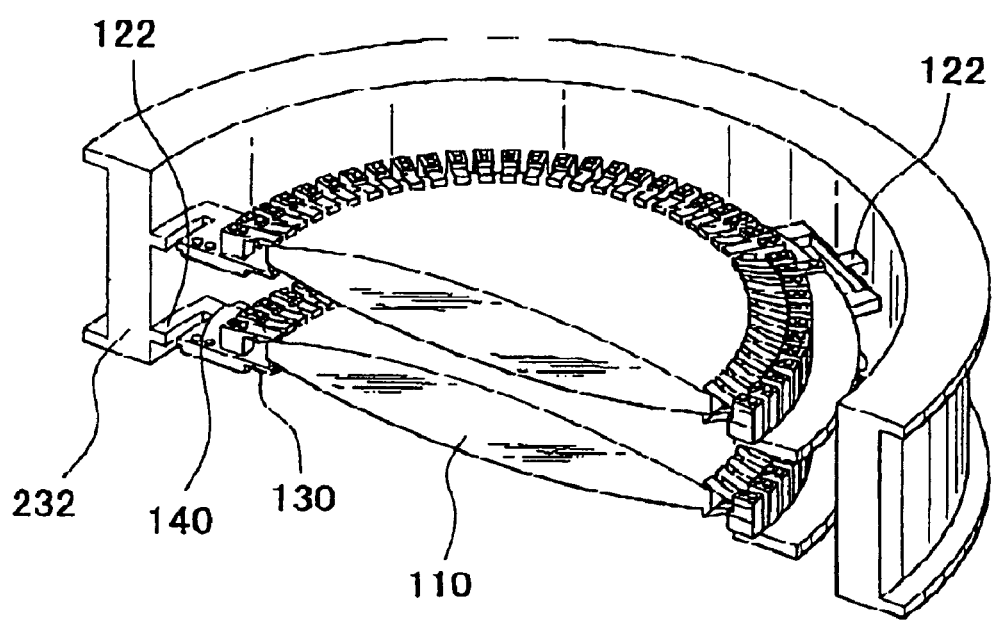
FIG. 9 is a schematic sectional and perspective view inside a lens barrel of the exposure apparatus of one embodiment according to the present invention.

The inventive retainer 100 may be used to hold the optical element, such as a lens in the projection optical system 230. The retainer 100 is connected to the lens barrel 232 in the projection optical system 230 through the spring member 122 that is provided on the cell member 120, as shown in FIG. 9, and may absorb a deformation in a radial direction. This structure may prevent the cell member 120 from decentering due to a relative displacement between the lens barrel and the cell member, which relative displacement results from different coefficients of linear expansion between them, when the temperature environment changes, for example, in carrying the apparatus. The projection optical system 230 may achieve desired optical performance by reducing the aberration that results from the deformation and positional offset of the optical element 110 which otherwise deteriorates imaging performance.

The plate 240 is an object to be exposed such as a wafer and a liquid crystal plate, and photoresist is applied onto it. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photo-resist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

The stage 245 supports the plate 240. The stage 240 may use any structure known in the art, and a detailed description of its structure and operation is omitted. The stage 245 may use, for example, a linear motor to move the plate 240 in XY directions. The mask 220 and plate 240 are, for example, scanned synchronously, and the positions of the stage 245 and a mask stage (not shown) are monitored, for example, by a laser interferometer and the like, so that both are driven at a constant speed ratio. The stage 245 is installed on a stage stool supported on the floor and the like, for example, via a damper, and the mask stage and the projection optical system 230 are installed on a lens barrel stool (not shown) supported, for example, via a damper to the base frame placed on the floor.

In exposure, light emitted from the light source 212, e.g., Koehler-illuminates the mask 220 via the illumination optical system 214. Light that passes through the mask 220 and reflects the mask pattern is imaged onto the plate 240 by the projection optical system 230. The projection optical system 230 and/or the illumination optical system 214 used for the exposure apparatus 200 include an optical element held by the inventive retainer 100, and reduce the deformation and the aberration resulting from the positional offset of the optical element, thus being able to provide high-quality devices (such as semiconductor devices, LCD devices, photographing devices (such as CCDs, etc.), thin film magnetic heads, and the like).

Figure 5:
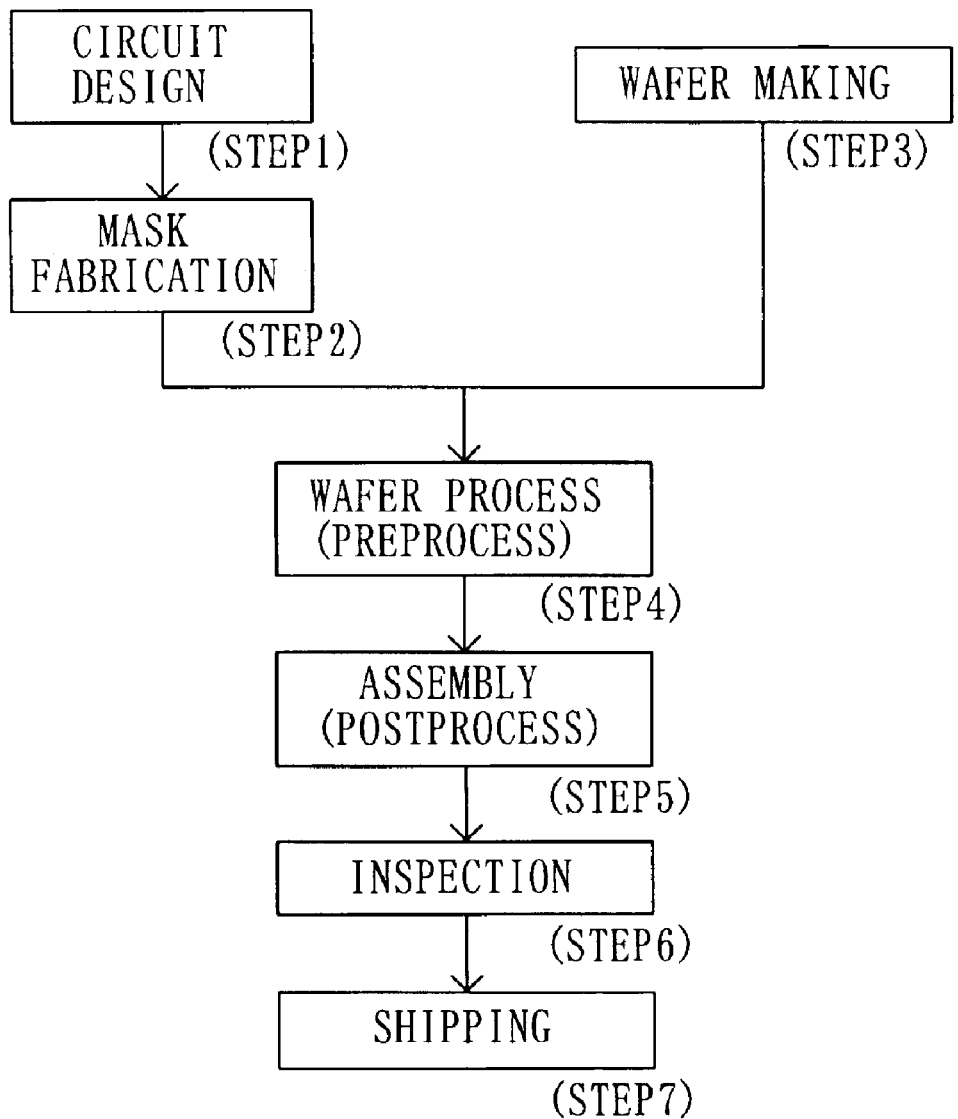
FIG. 5 is a flowchart for explaining a device fabrication method using an inventive exposure apparatus.
Figure 6:
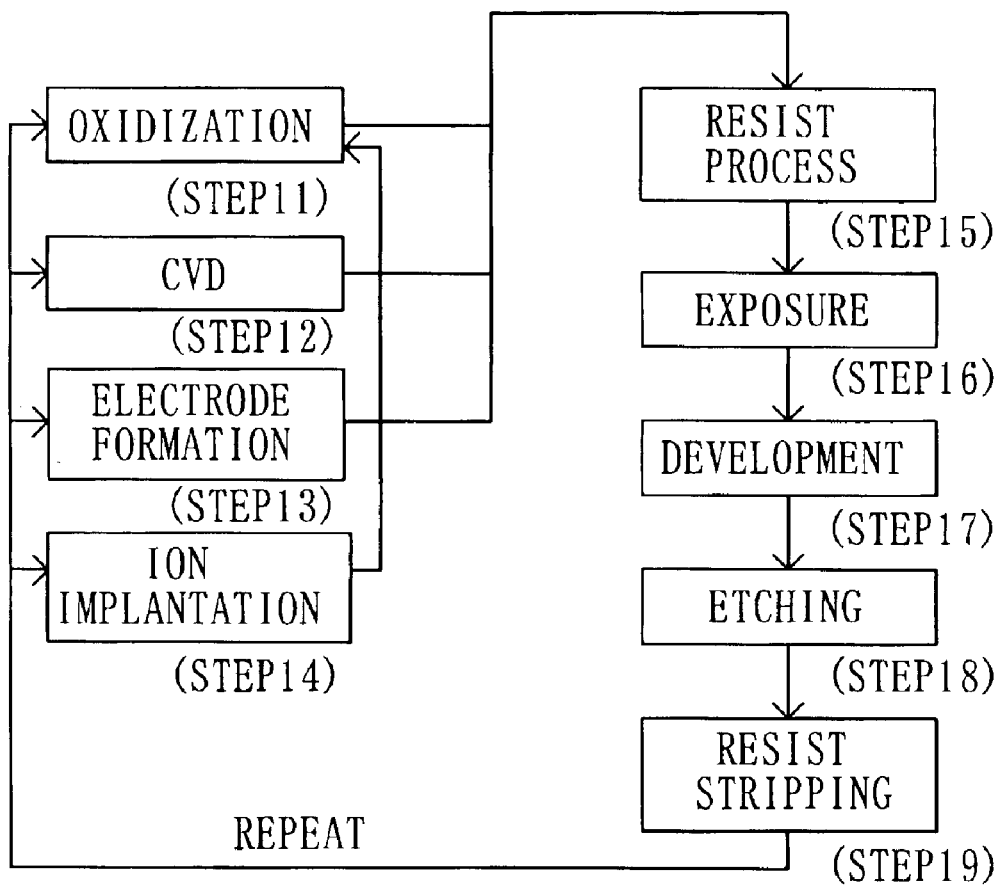
FIG. 6 is a detailed flowchart for Step 4 shown in FIG. 5.
Figure 7:
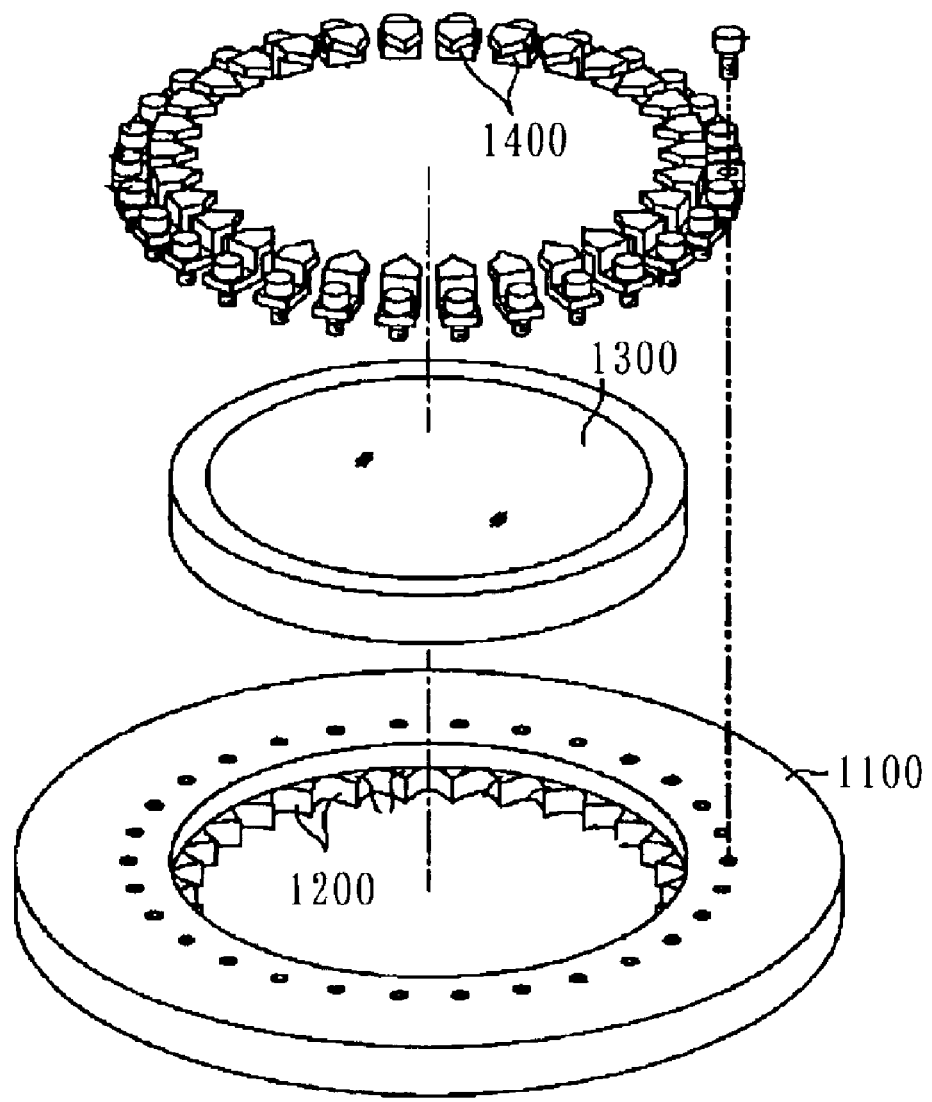
FIG. 7 is an exploded perspective view of a conventional exemplary retainer.
Figure 8:
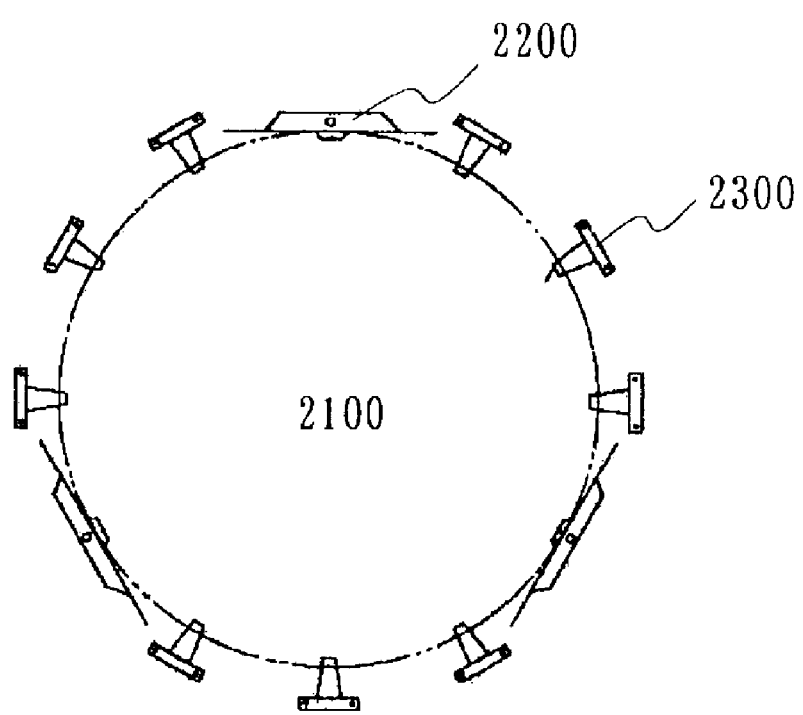
FIG. 8 is a schematic top transparent view of another conventional exemplary retainer.

Referring now to FIGS. 5 and 6, a description will be given of an embodiment of a device fabrication method using the above mentioned exposure apparatus 200. FIG. 5 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 6 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 300 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than ever.

Further, the present invention is not limited to these preferred embodiments and various variations and modifications may be made without departing from the scope of the present invention. For example, the inventive retainer may be used to hold various optical elements, such as a lens, mirror, and filter. The inventive retainer may be used to hold a mask and a wafer.

According to the inventive retainer, the dispersed stress applied to the optical element may provide a minimum stress to position the optical element in a direction perpendicular to the optical axis of the optical element without breaking the optical element, as well as holding the optical element while restraining its gravity deformation.

What is claimed is:

1. A holding apparatus for holding an optical element, said apparatus comprising:
 a plurality of support members for supporting the optical element;
 a first elastic member, arranged at a position different from positions of said plurality of support members in a direction along a circumference of the optical element, for applying a first force to the optical element substantially in an anti-gravity direction; and
 a second elastic member, arranged opposite to said first elastic member through the optical element and at a position different from the positions of said plurality of support members in the direction along the circumference of the optical element, for applying a second force to the optical element substantially in a gravity direction.

2. An apparatus according to claim 1, wherein the number of members in said plurality of support members is three, and said first elastic member and said second elastic member are provided between each two of said three support members in the direction along the circumference of the optical element.

3. An apparatus according to claim 1, wherein the first force is larger than the second force.

4. An apparatus according to claim 1, further comprising a plurality of press members, arranged opposite to corresponding one of said plurality of support members through the optical element, respectively, for applying a pressing force to the optical element.

5. An apparatus according to claim 4, wherein the first force ($F_1$), the second force ($F_2$) and the pressing force ($F_3$) satisfy the following equations:

$$F_{max} \geq F_1 \geq M(A/(\mu+1))/2n$$

$$F_{max} \geq F_2 \geq M(A/(\mu-1))/2n$$

$$F_{max} \geq F_3 \geq BM$$

where M is a mass of the optical element, n is the number of said first and second elastic members, $\mu$ is a coefficient of static friction between the optical element and the first and second elastic members, A is a lateral gravity resistance specification, B is a longitudinal gravity resistance specification, and $F_{max}$ is a breaking load of the optical element.

6. An apparatus according to claim 1, wherein said first and second elastic members have application surfaces, for applying the first and second forces to the optical element, respectively, shaped in accordance with a shape of the optical element.

7. An exposure apparatus, having an optical system and exposing a substrate to a pattern by directing light through said optical system, said apparatus comprising:
 a holding apparatus, as defined in claim 1, for holding an optical element in said optical system.

8. A device fabrication method, comprising the steps of:
 exposing a substrate to a pattern using an exposure apparatus as defined in claim 7; and
 developing the exposed substrate.

* * * * *